(12) United States Patent
Chuang et al.

(10) Patent No.: US 9,472,521 B2
(45) Date of Patent: Oct. 18, 2016

(54) SCHEME FOR CONNECTOR SITE SPACING AND RESULTING STRUCTURES

(71) Applicant: Taiwan Semiconductor Manufacturing Company, Ltd., Hsin-Chu (TW)

(72) Inventors: Yao-Chun Chuang, Hsin-Chu (TW); Chita Chuang, Kaohsiung (TW); Hao-Juin Liu, Kaohsiung (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/667,330

(22) Filed: Nov. 2, 2012

(65) Prior Publication Data

US 2013/0320524 A1 Dec. 5, 2013

Related U.S. Application Data

(60) Provisional application No. 61/653,277, filed on May 30, 2012.

(51) Int. Cl.
*H01L 23/48* (2006.01)
*H01L 23/00* (2006.01)

(52) U.S. Cl.
CPC ............ *H01L 24/13* (2013.01); *H01L 24/05* (2013.01); *H01L 23/562* (2013.01); *H01L 24/03* (2013.01); *H01L 24/11* (2013.01); *H01L 2224/03912* (2013.01); *H01L 2224/0401* (2013.01); *H01L 2224/05005* (2013.01); *H01L 2224/05022* (2013.01); *H01L 2224/0558* (2013.01); *H01L 2224/05124* (2013.01); *H01L 2224/05147* (2013.01); *H01L 2224/05572* (2013.01); *H01L 2224/05599* (2013.01); *H01L 2224/1146* (2013.01); *H01L 2224/1147* (2013.01);

(Continued)

(58) Field of Classification Search
CPC . H01L 23/485; H01L 24/14; H01L 23/3171; H01L 21/768
USPC .................................. 257/E21.508, E23.021
See application file for complete search history.

(56) References Cited

U.S. PATENT DOCUMENTS 5,943,597 A 8/1999 Kleffner et al.
6,218,281 B1 * 4/2001 Watanabe et al. ............ 438/612

(Continued)

FOREIGN PATENT DOCUMENTS

CN 101504935 8/2009
JP 5335313 12/1993

(Continued)

*Primary Examiner* — Roy Potter
*Assistant Examiner* — Paul Patton
(74) *Attorney, Agent, or Firm* — Slater Matsil, LLP

(57) ABSTRACT

A system and method for preventing cracks in a passivation layer is provided. In an embodiment a contact pad has a first diameter and an opening through the passivation layer has a second diameter, wherein the first diameter is greater than the second diameter by a first distance of about 10 μm. In another embodiment, an underbump metallization is formed through the opening, and the underbump metallization has a third diameter that is greater than the first diameter by a second distance of about 5 μm. In yet another embodiment, a sum of the first distance and the second distance is greater than about 15 μm.

14 Claims, 6 Drawing Sheets

(52) U.S. Cl.
CPC ............... *H01L2224/13083* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13169* (2013.01); *H01L 2224/13171* (2013.01); *H01L 2224/13172* (2013.01); *H01L 2224/13184* (2013.01); *H01L 2224/16238* (2013.01); *H01L 2924/00014* (2013.01)

(56) References Cited

U.S. PATENT DOCUMENTS

| | | |
|---|---|---|
| 6,229,220 B1 | 5/2001 | Saitoh et al. |
| 6,469,370 B1 | 10/2002 | Kawahara et al. |
| 6,578,754 B1 | 6/2003 | Tung |
| 6,592,019 B2 | 7/2003 | Tung |
| 6,693,361 B1 | 2/2004 | Siniaguine et al. |
| 6,818,545 B2 * | 11/2004 | Lee et al. ............... 438/614 |
| 6,853,076 B2 | 2/2005 | Datta et al. |
| 6,917,119 B2 | 7/2005 | Lee et al. |
| 6,956,292 B2 * | 10/2005 | Fan et al. ............... 257/780 |
| 6,977,213 B1 | 12/2005 | Tsai et al. |
| 7,064,436 B2 | 6/2006 | Ishiguri et al. |
| 7,288,429 B2 | 10/2007 | Yaung et al. |
| 7,312,535 B2 | 12/2007 | Takewaki et al. |
| 7,348,673 B2 | 3/2008 | Kikuchi et al. |
| 7,391,112 B2 | 6/2008 | Li et al. |
| 7,397,121 B2 | 7/2008 | Chou et al. |
| 7,973,418 B2 * | 7/2011 | Alvarado et al. ............ 257/780 |
| 8,072,070 B2 | 12/2011 | Lee et al. |
| 8,072,073 B2 | 12/2011 | Kikuchi et al. |
| 8,294,279 B2 | 10/2012 | Chen et al. |
| 8,362,588 B2 | 1/2013 | Lee et al. |
| 8,471,388 B2 | 6/2013 | Lin et al. |
| 2001/0040290 A1 | 11/2001 | Sakurai et al. |
| 2005/0277283 A1 | 12/2005 | Lin et al. |
| 2006/0220259 A1 | 10/2006 | Chen et al. |
| 2006/0263727 A1 | 11/2006 | Lee et al. |
| 2007/0045855 A1 | 3/2007 | Lo et al. |
| 2007/0205520 A1 | 9/2007 | Chou et al. |
| 2007/0232056 A1 | 10/2007 | Saitou et al. |
| 2008/0191366 A1 | 8/2008 | Hu et al. |
| 2008/0308934 A1 | 12/2008 | Alvarado et al. |
| 2009/0194889 A1 | 8/2009 | Jeng et al. |
| 2010/0044860 A1 | 2/2010 | Haba et al. |
| 2010/0187687 A1 * | 7/2010 | Liu ............... H01L 23/3157 257/738 |
| 2010/0244263 A1 | 9/2010 | Lin et al. |
| 2011/0037169 A1 | 2/2011 | Pagaila |
| 2011/0095415 A1 | 4/2011 | Topacio et al. |
| 2011/0101520 A1 | 5/2011 | Liu et al. |
| 2011/0121438 A1 * | 5/2011 | Hart ............... 257/659 |
| 2012/0049343 A1 * | 3/2012 | Schulze ............... H01L 24/11 257/737 |
| 2013/0320524 A1 | 12/2013 | Chuang et al. |
| 2014/0291838 A1 | 10/2014 | Chen et al. |
| 2015/0132941 A1 | 5/2015 | Liu |

FOREIGN PATENT DOCUMENTS

| | | |
|---|---|---|
| JP | 2000228420 | 8/2000 |
| JP | 2001257226 | 9/2001 |
| JP | 2004296621 | 10/2004 |
| JP | 2006032600 | 2/2006 |
| JP | 2007258438 | 10/2007 |
| JP | 2007273624 | 10/2007 |
| JP | 2008016514 | 1/2008 |
| JP | 2009071045 | 4/2009 |
| JP | 2009188288 | 8/2009 |
| KR | 20110051136 | 5/2011 |
| TW | 444298 | 7/2001 |
| TW | 200901413 | 1/2009 |

\* cited by examiner

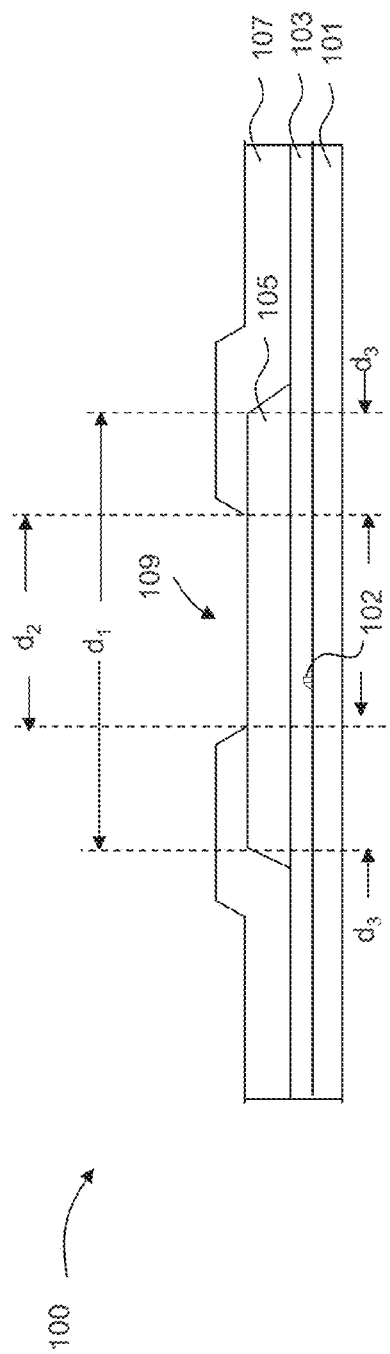

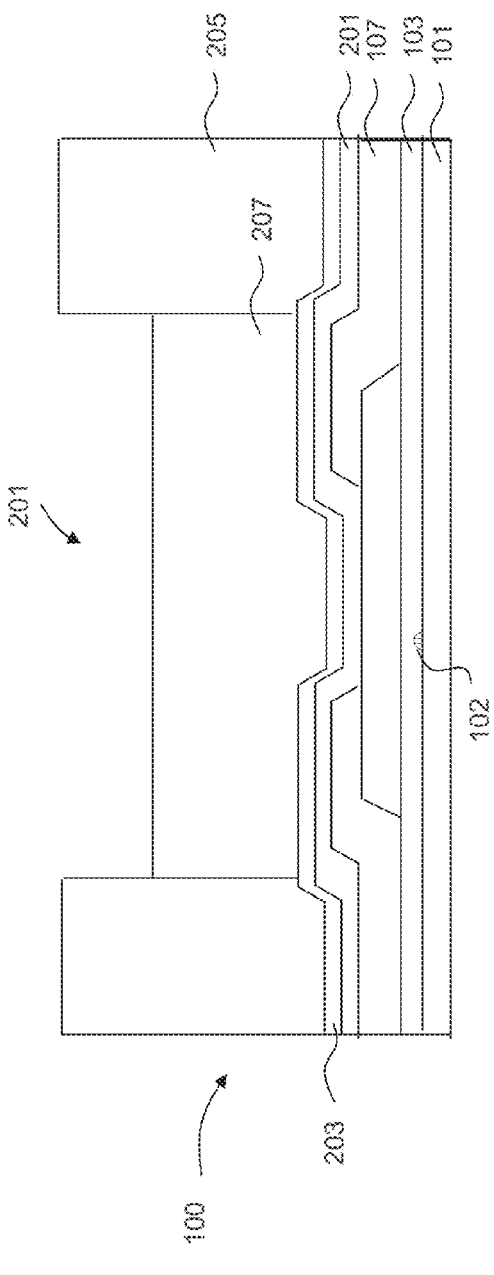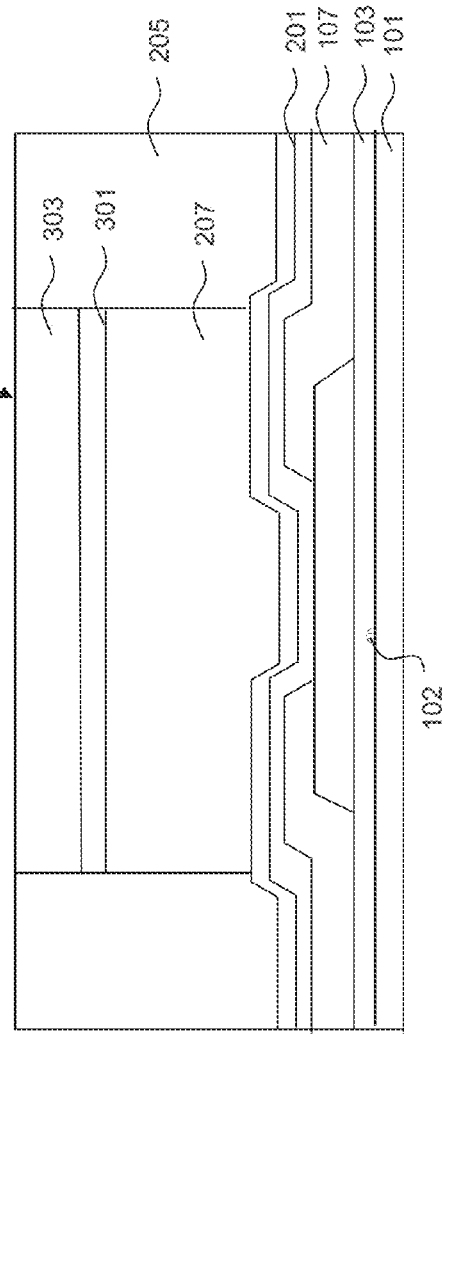

| TV | F2 LF3 GS1P | F2 LF3+ | F2 LF3+ |
|---|---|---|---|
| $d_1$ / side (A) | 65 | 74 | 74 |
| $d_2$ | 55 | 65 | 55 |
| $d_4$ / side (B) | 100 | 100 | 100 |
| $d_5$ | 17.5 | 13 | 13 |
| $d_3$ | 5 | 4.5 | 9.5 |
| A+B | 22.5 | 17.5 | 22.5 |
| Bump scheme | 35/0/15+SnCu | 35/0/15+SnCu | 35/0/15+SnCu |
| Passivation | 2 | 20 | 2 |

Figure 6C

SCHEME FOR CONNECTOR SITE SPACING AND RESULTING STRUCTURES

This application claims the benefit of U.S. Provisional Application No. 61/653,277 filed on May 30, 2012, entitled "Design Scheme for Connector Site Spacing and Resulting Structures," which application is hereby incorporated herein by reference.

BACKGROUND

Generally, a semiconductor die may be connected to other devices external to the semiconductor die through a type of packaging utilizing external connections. The external connections may be formed by initially forming a layer of underbump metallization in electrical connection with a contact pad on the semiconductor die and then placing additional conductive material onto the underbump metallization. In between the underbump metallization and the contact pad may be a passivation layer that is used to protect and support the structures of the semiconductor die. Once in place, the additional conductive material may be placed into physical contact with the external device and then the semiconductor device may be bonded to the external device. In such a fashion, a physical and electrical connection may be made between the semiconductor die and an external device, such as a printed circuit board, another semiconductor die, or the like.

However, the material that comprises the underbump metallization, the passivation layer, and the contact pad are different types of materials that are formed with different processes and are manufactured on top of one another and may include very different types of materials, such as dielectric materials, metallization materials, etch stop materials, barrier layer materials, and other materials utilized in the formation of the semiconductor die. Each one of these different materials has unique properties different from each other that can cause significant stresses to be applied to the materials in each of the layers. If not controlled, these stresses can cause cracks to form, for example, within the passivation layer between the contact pad and the underbump metallization. Such cracks can damage or even destroy the semiconductor die during the manufacturing process or else during its intended use.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1A-1B illustrate a formation of a contact pad, a passivation layer, and an opening through the passivation layer in accordance with an embodiment;

FIG. 2 illustrates a formation of an underbump metallization and an external contact in accordance with an embodiment;

FIG. 3 illustrates a formation of a first cap layer and a second cap layer in accordance with an embodiment;

FIGS. 6A-6C illustrate further experimental data in accordance with embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 4:
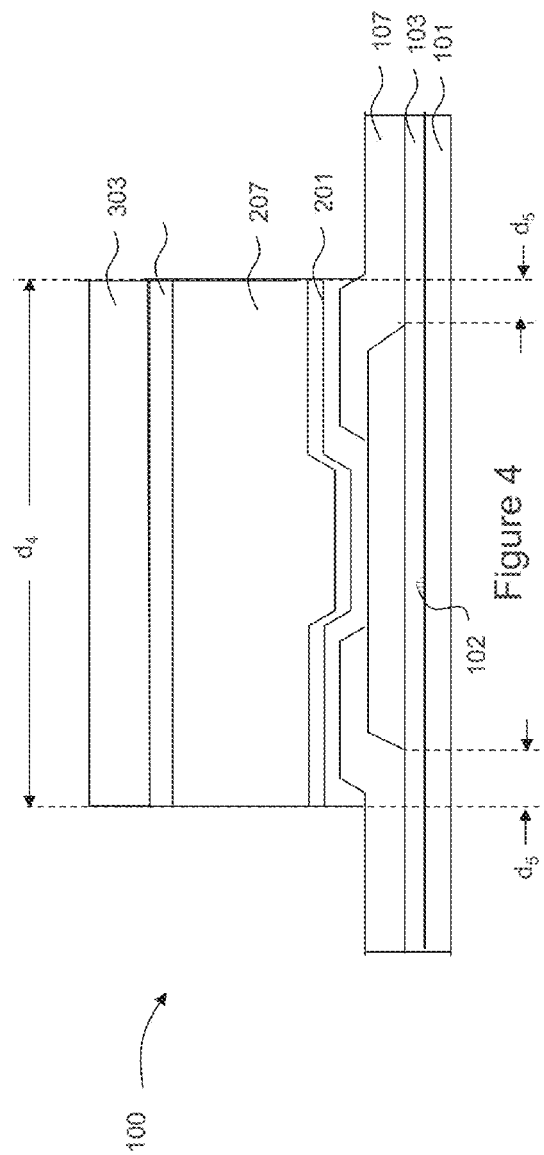
FIG. 4 illustrates a patterning of the underbump metallization layer in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a passivation, underbump metallization, and copper pillar formed on a contact pad. Other embodiments may also be applied, however, to other types of external contacts.

With reference now to FIG. 1, there is shown a portion of an embodiment of a semiconductor device 100. In an embodiment, the semiconductor device 100 may comprise a semiconductor substrate 101, active devices 102, metallization layers 103, a contact pad 105, and a first passivation layer 107. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof Other substrates that may be used include multi-layered substrates, gradient substrates, or hybrid orientation substrates.

Active devices 102 may be formed on the semiconductor substrate 101 (represented in FIG. 1A as a single transistor). As one of ordinary skill in the art will recognize, a wide variety of active devices and passive devices such as capacitors, resistors, inductors and the like may be used to generate the desired structural and functional requirements of the design for the semiconductor device 100. The active devices 102 may be formed using any suitable methods either within or else on the surface of the semiconductor substrate 101.

However, as one of ordinary skill will recognize, the above described semiconductor substrate 101 with active devices 102 is not the only substrate that may be used. Alternative substrates, such as a package substrate or an interposer that does not have active devices therein, may alternatively be utilized. These substrates and any other suitable substrates may alternatively be used and are fully intended to be included within the scope of the present embodiments.

The metallization layers 103 are formed over the semiconductor substrate 101 and the active devices 102 and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor device 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 μm and about 4 μm, such as about 1.45 μm.

Additionally, the contact pad 105 may be formed in such a fashion as to reduce or eliminate the occurrence of cracks around the contact pad 105 within the first passivation layer 107. In particular, by manufacturing the contact pad 105 with a certain relationship of either an opening 109 through the first passivation layer 107 (discussed further below) and/or a certain relationship with the UBM layer 201 (not illustrated in FIG. 1 but illustrated and discussed further below with reference to FIGS. 2-4), the number of cracks that may form within the first passivation layer 107 may be greatly reduced or even eliminated. In an embodiment, the contact pad 105 may be formed to have a diameter that is a first distance $d_1$ of between about 35 μm and about 100 μm, such as about 74 μm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 μm and about 5 μm, such as about 9.25 KÅ.

After the first passivation layer 107 has been formed, an opening 109 may be made through the first passivation layer 107 by removing portions of the first passivation layer 107 to expose at least a portion of the underlying contact pad 105. The opening 109 allows for contact between the contact pad 105 and the UBM layer 201 (discussed further below with respect to FIG. 2). The opening 109 may be formed using a suitable photolithographic mask and etching process, although any suitable process to expose portions of the contact pad 105 may be used.

The opening may also be manufactured with a second diameter $d_2$ that will work in conjunction with the first distance $d_1$ of the contact pad 105 in order to help reduce or eliminate the occurrence of cracks within the first passivation layer 107. In an embodiment a first difference in diameters between the opening and the contact pad 105 (represented in FIG. 1 by the third distance $d_3$) may be kept greater than about 10 μm (5 μm per side), such as about 11 μm. By keeping this difference in diameters greater than about 10 μm, the stresses within the first passivation layer 107 around the contact pad 105 may be better handled without producing cracks that can damage the semiconductor device 100.

FIG. 1B illustrates a chart that illustrates this reduction in the number of cracks when only the third distance $d_3$ is increased (the fifth distance $d_5$ labeled in the chart is not illustrated in FIG. 1A, but is illustrated and discussed below with respect to FIGS. 2-4). In particular, in an embodiment in which the semiconductor device 100 has an external contact 200 (not illustrated in FIG. 1A but illustrated and discussed below with respect to FIG. 2) has a 45/0/0 bump scheme (in which the external contact 200 has a copper layer of about 45 μm and no additional layers, such as nickel layers or lead-free solder caps), and with all other variables kept constant, the second diameter $d_2$ is reduced from 65 μm to 55 μm, which also causes an increase in the third distance $d_3$ from 9 μm to 19 μm. With this increase in the third distance $d_3$, the number of cracks that occurred was reduced from 74 to 20. As such, by controlling the third distance $d_3$, the number of cracks in the first passivation layer 107 may be greatly reduced, and the overall efficiency of the semiconductor device 100 may be improved.

FIG. 2 illustrates a formation of an external contact 200 in electrical connection with the contact pad 105 through the first passivation layer 107. In an embodiment the external contact 200 may be, e.g., a copper pillar or copper post. However, the embodiments are not limited to these, and may alternatively be solder bumps, copper bumps, or other suitable external contacts 200 that may be made to provide electrical connection from the semiconductor device 100 to other external devices (not individually illustrated in FIG. 2). All such external contacts are fully intended to be included within the scope of the embodiments.

In an embodiment in which the external contact 200 is a copper pillar, the external contact 200 may be formed by initially forming an under-bump-metallurgy (UBM) layer 201, a seed layer 203, and a polymer layer 205 with an opening. A contact 207 may be formed within the opening of the polymer layer 205. The UBM layer 201 may be formed in electrical contact with the contact pad 105. The UBM layer 201 may comprise a single layer of conductive material, such as a layer of titanium, or a layer of nickel. Alternatively, the UBM layer 201 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM layer 201. Any suitable materials or layers of material that may be used for the UBM layer 201 are fully intended to be included within the scope of the current embodiments. The UBM layer 201 may be created using processes such as sputtering, evaporation, or PECVD process, depending upon the desired materials. The UBM layer 201 may be formed to have a thickness of between about 0.7 μm and about 10 μm, such as about 5 μm.

The seed layer 203 may be formed in electrical contact with the UBM layer 201 on top of the contact pad 105. The seed layer 203 is a thin layer of a conductive material that aids in the formation of a thicker layer during subsequent processing steps. The seed layer 203 may comprise a layer of titanium about 1,000 Å thick followed by a layer of copper about 5,000 Å thick, which will be further used to connect to the contact 207. The seed layer 203 may be created using processes, such as sputtering, evaporation, or PECVD processes, depending upon the desired materials. The seed layer 203 may be formed to have a thickness of between about 0.7 μm and about 10 μm, such as about 5 μm.

The polymer layer 205 may be formed by coating on the seed layer 203. The polymer layer 205 may comprise benzene-based polymers, dioxane-based polymers, toluene-based polymers, phenylthiol-based polymers, phenol-based polymers, cyclohexane-based polymers, p-cresol-based polymers, combinations of these and the like. The formation methods include spin coating or other commonly used methods. The thickness of the polymer layer 205 may be between about 5 µm and about 30 µm. An opening of the polymer layer 205 may be formed using photolithography techniques to expose a portion of the seed layer 203 where the contact 207 will be formed.

The contact 207 comprises one or more conductive materials, such as copper, tungsten, other conductive metals, or the like, and may be formed, for example, by electroplating, electroless plating, or the like. In an embodiment, an electroplating process is used wherein the semiconductor device 100 is submerged or immersed in an electroplating solution. The semiconductor device 100 surface is electrically connected to the negative side of an external DC power supply such that the semiconductor device 100 functions as the cathode in the electroplating process. A solid conductive anode, such as a copper anode, is also immersed in the solution and is attached to the positive side of the power supply. The atoms from the anode are dissolved into the solution, from which the cathode, e.g., the semiconductor device 100, acquires the dissolved atoms, thereby plating the exposed conductive areas of the semiconductor device 100, e.g., the exposed portions of the seed layer 203 within the opening of the polymer layer 205.

FIG. 3 illustrates a formation of a first cap layer 301 and a second cap layer 303 on the contact 207. In an embodiment the first cap layer 301 may be formed over the contact 207. For example, in an embodiment in which the contact 207 is formed of copper, the first cap layer 301 may be formed of nickel, although other materials, such as Pt, Au, Ag, Ni, Co, V, Cr, Sn, Pd, Bi, Cd, Zn, combinations thereof, or the like, may also be used. The first cap layer 301 may be formed through any number of suitable techniques, including PVD, CVD, ECD, MBE, ALD, electroplating, and the like.

The second cap layer 303 may be formed on the first cap layer 301. The second cap layer 303 may be of solder materials comprising SnAu, SnPb, a high-Pb material, a Sn-based solder, a lead-free solder, a SnAg solder, a SnAgCu solder, or other suitable conductive material. The second cap layer 303 may be formed through any number of suitable techniques, including PVD, CVD, ECD, MBE, ALD, electroplating, and the like.

The number of layers on the contact 207, such as the first cap layer 301 and the second cap layer 303, is for illustration purposes only and is not limiting. There may be a different number of layers formed on the contact 207. The various layers on the contact 207 may be formed with different materials, of various shapes. The contact 207, the first cap layer 301, and the second cap layer 303 may collectively be called a metal contact 120.

FIG. 4 illustrates a removal of the polymer layer 205 and a patterning of the seed layer 203 and the UBM layer 201. In an embodiment, a plasma ashing process may be used to remove the polymer layer 205, whereby the temperature of the polymer layer 205 may be increased until the polymer layer 205 experiences a thermal decomposition and may be removed. However, any other suitable process, such as a wet strip, may alternatively be utilized. The removal of the polymer layer 205 may expose the underlying portions of the seed layer 203.

Exposed portions of the seed layer 203 may be removed by, for example, a wet or dry etching process. For example, in a dry etching process reactants may be directed towards the seed layer 203, using the first cap layer 301 and the second cap layer 303 as masks. Alternatively, etchants may be sprayed or otherwise put into contact with the seed layer 203 in order to remove the exposed portions of the seed layer 203. After the exposed portion of the seed layer 203 has been etched away, a portion of the UBM layer 201 will be exposed.

The exposed portions of the UBM layer 201 may then be removed by, for example, a dry etching process. The dry etching may be done using chemicals such as, $CF_4$, or $CHF_3$. Any existing etching technology or future developed etching technology may be used. After the UBM layer 109 has been etched away, a portion of the first passivation layer 107 will be exposed.

Once the exposed portions of the UBM layer 201 have been removed, the UBM layer 201 may have a fourth diameter $d_4$, which may be used in conjunction with the first diameter $d_1$ of the contact pad 105 in order to help reduce or eliminate cracks that can form within the first passivation layer 107. In particular, a second difference in diameters between the UBM layer 201 and the contact pad 105 (represented in FIG. 4 by a fifth distance $d_5$) may be kept at a certain range or ratio in order to help prevent cracks from forming within the first passivation layer 107.

Figure 5:
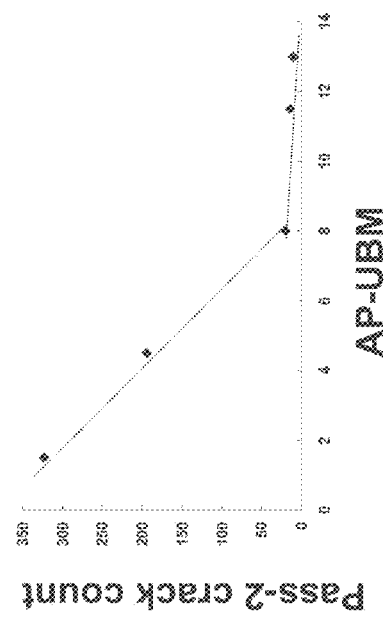
FIG. 5 illustrates experimental data of the benefits of embodiments.

For example, FIG. 5 illustrates resulting numbers of cracks that occur in the first passivation layer 107 at difference values of the fifth distance $d_5$. As can clearly be seen, there are a large number of cracks that will form within the first passivation layer 107 when the fifth distance $d_5$ is below about 8 µm. However, the number of cracks in the first passivation layer 107 is greatly reduced when the fifth distance $d_5$ is greater than about 5 µm, and will saturate with a reduced number of cracks at about 10 µm or greater. By reducing the number of cracks, the dependability of the overall semiconductor device 100 may be improved, thereby improving performances as well as yields.

In another embodiment, in addition to simply modifying the third distance $d_3$ (as described above with respect to FIGS. 1A-1B), or simply modifying the fifth distance $d_5$ (as described above with respect to FIGS. 4-5), both the third distance d3 and the fifth distance $d_5$ may be modified at the same time in order to produce even greater results. For example, in an embodiment the third distance $d_3$ may be kept greater than 10 µm while the fifth distance $d_5$ may be kept greater than about 5 µm. Additionally, a sum of the third distance $d_3$ and the fifth distance $d_5$ ($d_3+d_5$) may be kept greater than about 15 µm.

Figures 6A, 6B:
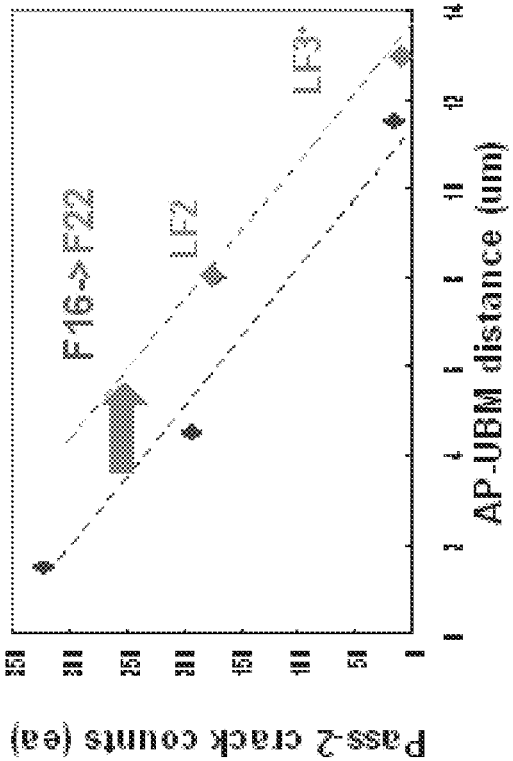

FIGS. 6A-6B illustrate comparative results of the combined modifications of the third distance $d_3$ and the fifth distance $d_5$. For example, in FIG. 6A, for a embodiment in which the bump scheme is 45/0/0 (similar to FIG. 1B above) and is bonded to, e.g., a sacrificial layer that may comprise Sn, Ag, and/or Cu, the number of cracks in the first passivation layer 107 may be reduced to below 20 with a third distance $d_3$ of 24 µm (12 µm per side of the third distance $d_3$) and a fifth distance $d_5$ of 24 µm (11.5 µm/side), for a combined sum of 47 µm (23.5 µm/side).

FIG. 6B illustrates the results of the table illustrated in FIG. 6A in graphical format. As can be seen, by also controlling the third distance $d_3$ in addition to the fifth distance $d_5$, the number of cracks may be reduced within the first passivation layer 107.

FIG. 6C illustrates another table of results for a separate bump scheme in which the external contact 200 has a 35/0/15+SnCu bump scheme. For example, the external contact 200 may have a copper layer of about 35 µm with a SnAg layer of about 15 µm over the copper layer. A SnCu cap may be used over the SnAg, and the SnCu cap may comprise about 98.2% Sn and about 1.8% Cu. As can be seen, by keeping the third distance $d_3$ greater than 10 µm (5 µm/side) and by keeping the fifth distance $d_5$ greater than 5

μm (2.5 μm/side), the number of cracks within the first passivation layer 107 may be kept to a small number. However, if these ratios are not used, for example if the third distance $d_3$ is below 10 μm (5 μm/side) such as 9 μm (4.5 μm/side), the number of cracks that can occur within the first passivation layer 107 can jump to a larger number.

Figure 7:
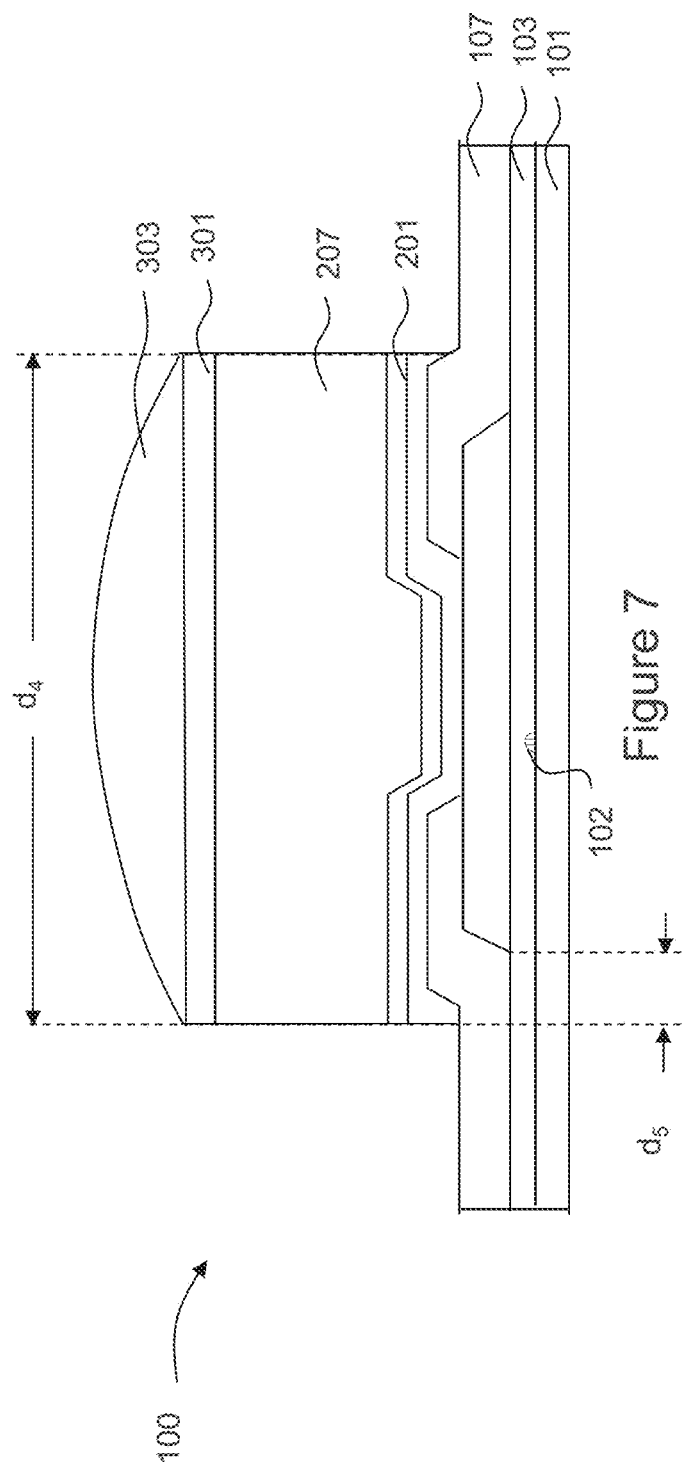
FIG. 7 illustrates a reflow process in accordance with an embodiment.

FIG. 7 illustrates that, once the second cap layer 303 has been formed on the first cap layer 301 and the exposed portions of the UBM layer 201 have been removed, a reflow process may be performed to transform the second cap layer 303 into a bump shape. In the reflow process the temperature of the second cap layer 303 is raised to between about 200° C. and about 260° C., such as about 250° C., for between about 10 seconds and about 60 seconds, such as about 35 seconds. This reflow process partially liquefies the second cap layer 303, which then pulls itself into the desired bump shape due to the second cap layer's 303 surface tension.

By manufacturing the contact pad 105, the opening through the first passivation layer 107, and the UBM layer 201 within the relationships described herein, the number of cracks that form within the first passivation layer 107 may be reduced or eliminated. By reducing the number of undesirable cracks within the first passivation layer 107, the protection afforded by the first passivation layer 107 may be maintained during further processing and usage of the semiconductor device 100. Such protection increase the overall efficiency of the manufacturing process and lead to greater yields and better improvement for each semiconductor device.

In an embodiment, a semiconductor device comprising a contact pad with a first diameter and an underbump metallization in electrical connection with the contact pad is provided. The underbump metallization has a second diameter, wherein the second diameter is greater than the first diameter by a first distance of about 10 μm.

In yet another embodiment, a semiconductor device comprising a contact pad on a substrate, the contact pad comprising a first dimension, is provided. A passivation layer is at least partially over the contact pad, and an opening is through the passivation layer, the opening comprising a second dimension. An underbump metallization extends through the opening to contact the contact pad, the underbump metallization comprising a third dimension, wherein the third dimension is greater than the first dimension by a first value of greater than about 5 μm.

In yet another embodiment, a method of manufacturing a semiconductor device comprising forming a contact pad on a substrate, the contact pad comprising a first diameter, is provided. A passivation layer is deposited over the contact pad, and the passivation layer is patterned to form an opening through the passivation layer, the opening having a second diameter smaller than the first diameter. An underbump metallization is formed to extend through the opening, the underbump metallization having a third diameter greater than the first diameter by a first distance greater than about 5 μm.

Although the present embodiments and their advantages have been described in detail, it should be understood that various changes, substitutions and alterations can be made herein without departing from the spirit and scope of the disclosure as defined by the appended claims. For example, the type of external contact may be modified, or the precise materials and processes used may be changed, while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a contact pad with a first diameter, wherein the contact pad is circular;
   an underbump metallization in electrical connection with the contact pad, characterized in that the underbump metallization has a second diameter that is greater than the first diameter by a first distance of about 10 μm, wherein an interface between the contact pad and the underbump metallization has a second diameter that is less than the first diameter by at least about 10 μm;
   a first passivation layer located at least partially between the contact pad and the underbump metallization; and
   an external contact formed on the underbump metallization, wherein the external contact is a copper pillar with first sidewalls, wherein the first sidewalls are substantially aligned with second sidewalls of the underbump metallization.

2. The semiconductor device of claim 1, further comprising an opening through the passivation layer, wherein the underbump metallization extends through the opening to contact the contact pad, the opening having a second diameter, wherein a difference between the first diameter and the second diameter is a second distance of about 5 μm.

3. The semiconductor device of claim 2, wherein a sum of the first distance and the second distance is greater than about 15 μm.

4. The semiconductor device of claim 1, wherein the contact pad is aluminum.

5. A semiconductor device comprising:
   a contact pad on a substrate, the contact pad comprising a first dimension;
   a passivation layer at least partially over the contact pad;
   an opening through the passivation layer, the opening comprising a second dimension;
   an underbump metallization extending through the opening to contact the contact pad, the underbump metallization comprising a third dimension, wherein the third dimension is greater than the first dimension by a first value of greater than about 5 μm, and wherein the first dimension is greater than the second dimension by a second value greater than about 10 μm; and
   an external contact over the underbump metallization, wherein the external contact is a copper pillar and has sidewalls that are substantially planar with the underbump metallization.

6. The semiconductor device of claim 5, wherein a sum of the first value and the second value is greater than about 15 μm.

7. The semiconductor device of claim 5, wherein the contact pad is aluminum.

8. A method of manufacturing a semiconductor device, the method comprising:
   forming a contact pad on a substrate, the contact pad comprising a first diameter;

depositing a passivation layer over the contact pad, wherein a first material extends from a first side of the passivation layer to a second side of the passivation layer opposite the first side of the passivation layer, the first side facing the contact pad;

patterning the passivation layer to form an opening through the passivation layer, the opening having a second diameter smaller than the first diameter; and forming an underbump metallization extending through the opening, the underbump metallization having a third diameter greater than the first diameter by a first distance greater than about 5 μm, wherein the forming the underbump metallization further comprises:

blanket depositing an underbump metallization layer in physical contact with the second side of the passivation layer;

forming an external contact onto the underbump metallization layer; and removing portions of the underbump metallization layer using the external contact as a mask.

9. The method of claim 8, wherein the first diameter is greater than the second diameter by a second distance greater than about 10 μm.

10. The method of claim 9, wherein a sum of the first distance and the second distance is greater than about 15 μm.

11. The method of claim 8, wherein the forming the external contact further comprises forming a copper pillar.

12. The method of claim 11, wherein the forming the copper pillar is performed at least in part with an electroplating process.

13. The method of claim 8, wherein the forming the contact pad further comprises:

blanket depositing a layer of aluminum; and removing portions of the layer of aluminum to form the contact pad.

14. The semiconductor device of claim 1, further comprising:

a first cap layer over the external contact; and a second cap layer over the first cap layer, wherein the second cap layer is a different material than the first cap layer.

* * * * *